(12) United States Patent
Rizzo et al.

(10) Patent No.: US 6,783,994 B2
(45) Date of Patent: Aug. 31, 2004

(54) METHOD OF FABRICATING A SELF-ALIGNED MAGNETIC TUNNELING JUNCTION AND VIA CONTACT

(75) Inventors: Nicholas D. Rizzo, Gilbert, AZ (US); Kelly W. Kyler, Mesa, AZ (US); Gregory W. Grynkewich, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/133,136

(22) Filed: Apr. 26, 2002

(65) Prior Publication Data
US 2003/0203509 A1 Oct. 30, 2003

(51) Int. Cl.[7] .................. H01L 21/00; G11C 15/02; G11C 11/15
(52) U.S. Cl. .............. 438/3; 365/50; 365/158; 365/173; 438/739
(58) Field of Search ............... 438/739, 3; 365/50, 365/158, 171–173

(56) References Cited

U.S. PATENT DOCUMENTS

| | | | | |
|---|---|---|---|---|
| 5,940,319 A | * | 8/1999 | Durlam et al. | 365/171 |
| 6,153,443 A | * | 11/2000 | Durlam et al. | 438/3 |
| 6,174,737 B1 | * | 1/2001 | Durlam et al. | 438/3 |
| 6,518,071 B1 | | 2/2003 | Durlam et al. | |
| 2002/0036919 A1 | | 3/2002 | Daughton et al. | |
| 2002/0042158 A1 | | 4/2002 | Kersch et al. | |

FOREIGN PATENT DOCUMENTS

| | | |
|---|---|---|
| EP | 1134743 A2 | 9/2001 |
| WO | WO 02/19338 A1 | 3/2002 |

* cited by examiner

Primary Examiner—Erik Kielin
(74) Attorney, Agent, or Firm—Ingrassia Fisher & Lorenz PC

(57) ABSTRACT

A method of fabricating a magnetoresistive random access memory device comprising the steps of providing a substrate, forming a first conductive layer positioned on the substrate, forming a conductive material stack region with a flat surface, the conductive material stack region being positioned on a portion of the first conductive layer, and forming a magnetoresistive random access memory device positioned on the flat surface of the conductive material stack region, the magnetoresistive random access memory device being isolated from the first conductive layer and subsequent layers grown thereon.

8 Claims, 4 Drawing Sheets

METHOD OF FABRICATING A SELF-ALIGNED MAGNETIC TUNNELING JUNCTION AND VIA CONTACT

This invention was made with Government support under Agreement No. MDA972-96-3-0016 awarded by DARPA. The Government has certain right in the invention.

FIELD OF THE INVENTION

This invention relates to semiconductor memory devices.

More particularly, the present invention relates to improved methods of fabricating semiconductor random access memory devices that utilize a magnetic field.

BACKGROUND OF THE INVENTION

A magnetoresistive random access memory (hereinafter referred to as "MRAM") device has a structure which includes ferromagnetic layers separated by a non-ferromagnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions as information which are called "Parallel" and "Anti-parallel" states, respectively. In response to Parallel and Anti-parallel states, the magnetic memory element represents two different resistances. The resistance indicates minimum and maximum values when the magnetization vectors of two magnetic layers point in substantially the same and opposite directions, respectively. Accordingly, a detection of changes in resistance allows an MRAM device to provide information stored in the magnetic memory element.

A MRAM device integrates magnetic memory elements and other circuits, for example, a control circuit for magnetic memory elements, comparators, for detecting states in a magnetic memory element, input/output circuits, etc. These circuits are fabricated in the process of complimentary metal oxide semiconductor (hereinafter referred to as "CMOS") technology in order to lower the power consumption of the MRAM device. The CMOS process requires high temperature steps which exceeds 300° C. for depositing dielectric and metal layers and annealing implants, for example.

Magnetic layers employ ferromagnetic materials such as cobalt-iron (CoFe) and nickel-iron-cobalt (NiFeCo) which requires processing below 300° C. in order to prevent intermixing of materials caused by high temperatures. Accordingly, magnetic memory elements need to be fabricated at a different stage after CMOS processing.

Further, magnetic memory elements contain components that are easily oxidized and also sensitive to corrosion. To protect magnetic memory elements from degradation and keep the performance and reliability of the MRAM device, a passivation layer is formed over magnetic memory elements.

In addition, a magnetic memory element includes very thin layers, some of which are tens of angstroms thick. The performance of the magnetic memory element is sensitive to the surface conditions on which magnetic layers are deposited. Accordingly, it is necessary to make a flat surface to prevent the characteristics of a MRAM device from degrading. Also, magnetic memory elements are typically very small which makes it extremely difficult to connect the magnetic memory element to circuitry by using photolithography processes where the alignment tolerances are tight.

Further, the materials comprising the ferromagnetic layers are difficult to etch because they are typically non-volatile in conventional low temperature plasmas and are very thin which makes them sensitive to corrosion from conventional chlorine based chemistries.

It would be highly advantageous, therefore, to remedy the foregoing and other deficiencies inherent in the prior art.

SUMMARY OF THE INVENTION

To achieve the objects and advantages specified above and others, an improved method of fabricating a self-aligned MRAM device and via contact is disclosed. The method involves forming magnetic memory elements on circuitry for controlling operations of magnetic memory elements. First, the circuitry is formed on a substrate under the CMOS process which requires a heat treatment of 300° C. or more. While fabricating the circuitry, conductive lines are also formed, which are used to create magnetic fields for writing and/or reading states in the magnetic memory element. The metal lines are enclosed by high permeability material such as a permalloy layer which facilitates magnetic fields to concentrate on the magnetic memory element. After completion of the circuitry, a surface of a layer including the circuitry is polished by the chemical mechanical (hereinafter referred to as "CMP") process which produces a flat surface on the layer including the circuitry, then the magnetic memory element is formed thereon. The flat surface prevents the characteristics of the magnetic memory element from degrading. Fabrication of the magnetic memory element after the CMOS process improves the performance and reliability of the magnetic memory element and avoids thermal degradation of the magnetic memory element.

Further, the MRAM device is deposited on a pillar of a conductor layer so that the layers included therein are self-aligned. By self-aligning the layers on the pillar, difficult and expensive photolithography processing steps are avoided. Also, the need to etch ferromagnetic layers is eliminated because the MRAM device is positioned on a pillar which isolates it from subsequent layers grown thereon.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
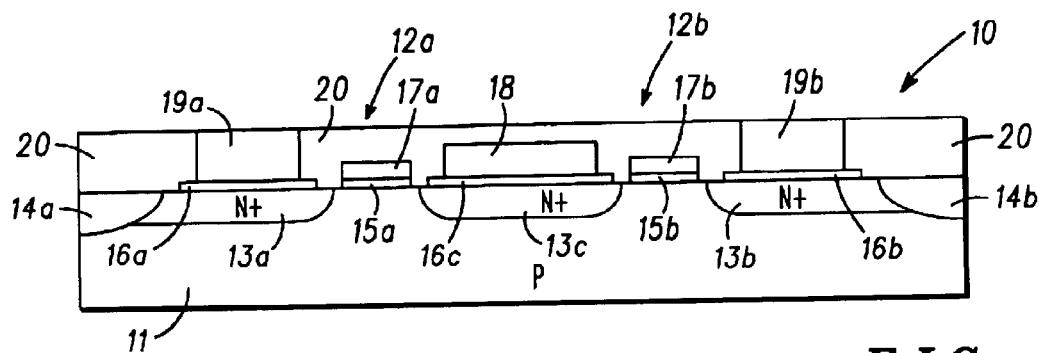
FIGS. 1 through 6 are simplified cross-sectional views illustrating several steps in a method of fabricating a self-aligned MRAM device in accordance with the present invention.

Referring specifically to FIG. 1, a cross-sectional view of a partially fabricated MRAM device 10 is illustrated, wherein device 10 has circuitry, for instance, NMOS or PMOS switching transistors 12a and 12b which are fabricated by the well know CMOS process. Other circuit elements, for example, input/output circuit, data/address decoder, and comparators, may be contained in the MRAM device, however they are omitted from the drawings for simplicity.

First of all, substrate 11 is provided to pattern windows for $N^+$ regions 13a, 13b, and 13c and implant the source/drain regions 13a, 13b, and 13c. Then isolation regions 14a and 14b are formed for separation. Next, poly-Silicon layers 15a and 15b are deposited on substrate 11 for forming gate regions, and are doped appropriately for forming switching transistors 12a and 12b as either NMOS or PMOS. Metal layers 16a and 16b are deposited on $N^+$ region 13a and 13b for source electrodes while metal layer 16c is deposited on $N^+$ region 13c for a drain electrode. Further, metal layers 17a and 17b for gate electrodes are deposited on poly-Siicon layers 15a and 15b, respectively. A conductor line 18 is formed on metal layer 16c, which provides a sense current to magnetic memory elements through transistors 12a and 12b. A magnetic memory element will be explained hereinafter. Plug conductors 19a and 19b, which work for conducting a sense current to magnetic memory elements, are formed on and interconnected to metal layers 16a and 16b, respectively. All circuit elements of an MRAM device, except magnetic memory elements, digit lines and word lines, are integrated on substrate 11 before dielectric material 20 is filled. Then, a surface of device 10 is polished by the CMP process which ensures the top surface of dielectric layer 20 is flat.

Figure 2:
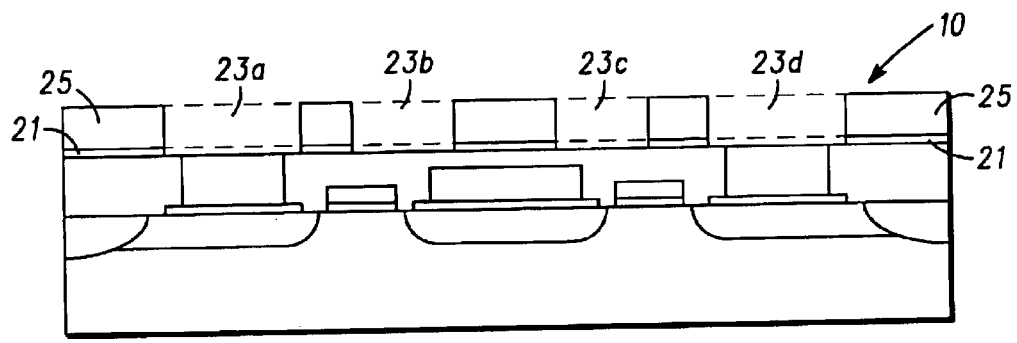

After partially fabricated MRAM device 10 has been completed, magnetic memory elements are formed on device 10 along with digit lines and word lines. As shown in FIG. 2, an etch stop layer 21, which employs material such as aluminum nitride (AlN), aluminum oxide (AlO), and silicon nitride (SiN), is deposited on the surface of device 10. Instead of etch stop layer 21, other techniques such as endpoint etches may be used. A silicon dioxide layer 25 is deposited with a thickness of 4,000 Å to 6000 Å on etch stop layer 21.

In the next step, a mask layer is deposited on silicon dioxide layer 25 and is patterned and defined as an etching mask using a standard photolithography technique. As shown in FIG. 2, silicon dioxide 25 is etched away to etch stop layer 21 that makes trenches 23a through 23d in silicon dioxide layer 25, and the exposed etch stop layer is removed from trenches 23a through 23d.

Figure 3:
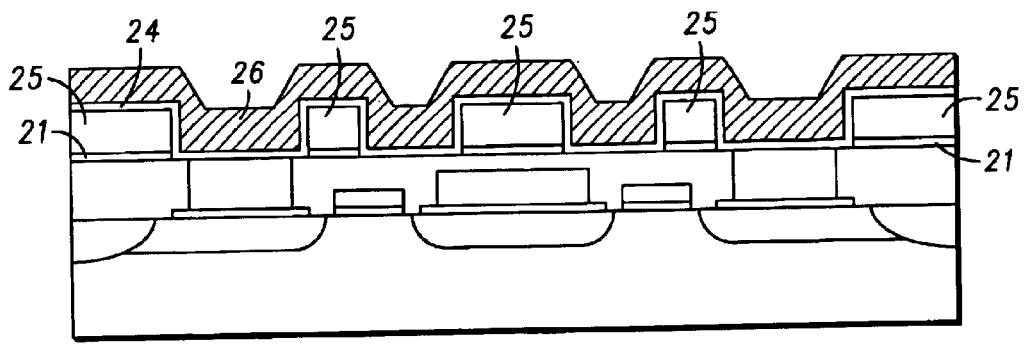
Figure 4:
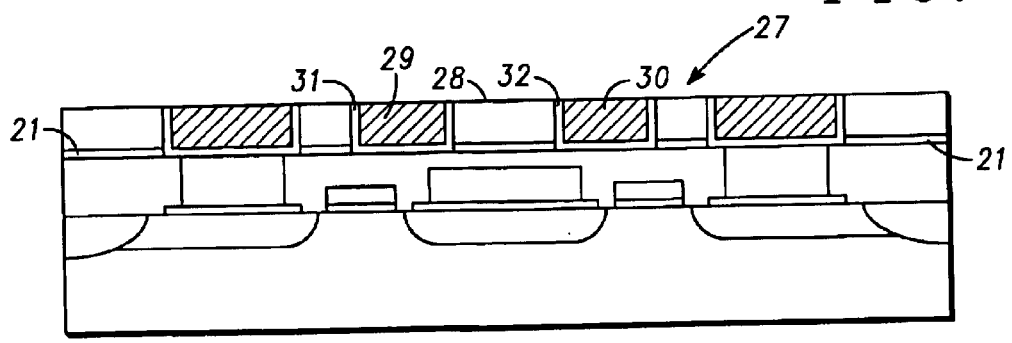

Referring to FIG. 3, a thin field focusing layer 24 having a high permeability such as nickel-iron (NiFe) is deposited overlying trenches 23a through 23d and a silicon dioxide dielectric layer 25. High permeability layer 24 is 100 Å to 500 Å thick. In order to improve adhesion of field focusing layer 24 and to provide a barrier for nickel (Ni) or iron (Fe) diffusion into dielectric layer of tantalum (Ta) or tantalum nitride (TaN) or other such materials could be added between field focusing layer 24 and dielectric layer 25. A conductor metal layer 26 is then deposited on field focusing layer 24. As a conductor metal, aluminum (Al), aluminum alloys, copper (Cu), and copper alloys are employed. In order to improve adhesion of field focusing layer 24 and to provide a barrier for nickel (Ni) or iron (Fe) diffusion into the conductor and/or dielectric a layer of tantalum (Ta) or tantalum nitride (TaN) or such material could be added between field focusing layer 24 and conductor layer 26. After depositing metal layer 26, the metal bulged out of trenches 23a through 23d and the high permeability layer 24 on silicon dioxide layer 25 is removed from a top surface by the CMP process so that, as shown in FIG. 4, a partially fabricated MRAM device 27 having a flat top surface is produced.

Partially fabricated MRAM device 27 includes torque or digit lines 29 and 30 (metal layer 26 in FIG. 3) on which magnetic memory elements are formed. Digit lines 29 and 30 carry a current to generate a magnetic field which causes magnetic memory elements to store more states. Digit lines 29 and 30 are enclosed by high permeability layers 31 and 32 (layer 24 in FIG. 3) excluding a portion on the top surface 28. Layer 31, for example, shields the magnetic field generated by current flowing in digit line 29 from magnetic field leakage, and facilitates the magnetic field to focus on a magnetic memory element places on digit line 29 through top surface 28 not covered by layer 31.

Figure 5:
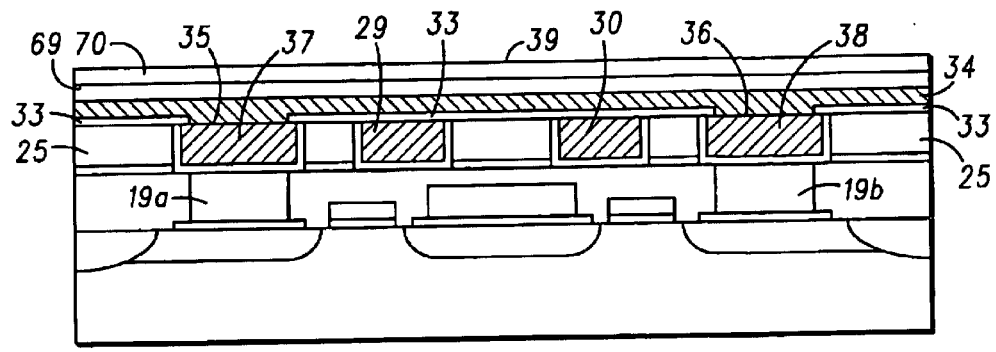

Referring to FIG. 5, a dielectric layer 33 is deposited over digit lines 29 and 30 and dielectric layer 25, and a conductor layer 34 is deposited over dielectric layer 33. Dielectric layer 33 is placed between digit lines 29 and 30 and conductor layer 34 to provide electrical isolation therebetween. Dielectric layer 33 is partially etched to make windows 35 and 36 on metal conductors 37 and 38 which are employed to electrically connect plug conductors 19a and 19b to conductor layer 34. After making windows 35 and 36, conductor layer 34 is deposited with a thickness of around 500 Å over dielectric layer 33 and metal conductors 37 and 38. Further, a conductor layer 69 is positioned on conductor layer 34 and a conductor layer 70 is positioned on metal layer 69. It will be understood that conductor layers 34, 69, and 70 can include a metal, such as aluminum (Al) or copper (Cu), or another suitable conductive material. However, in the preferred embodiment, conductor layer 69 includes tantalum (Ta) and conductor layer 70 includes aluminum (Al). In order to form magnetic memory elements on conductor layer 70, a top surface of conductor layer 70 needs to be smooth and flat because magnetic memory elements have very thin films, thereby a good condition for a magnetic memory element is attained. Surface 39 is polished and formed by a planarizing process such as CMP or the like.

Figure 6:
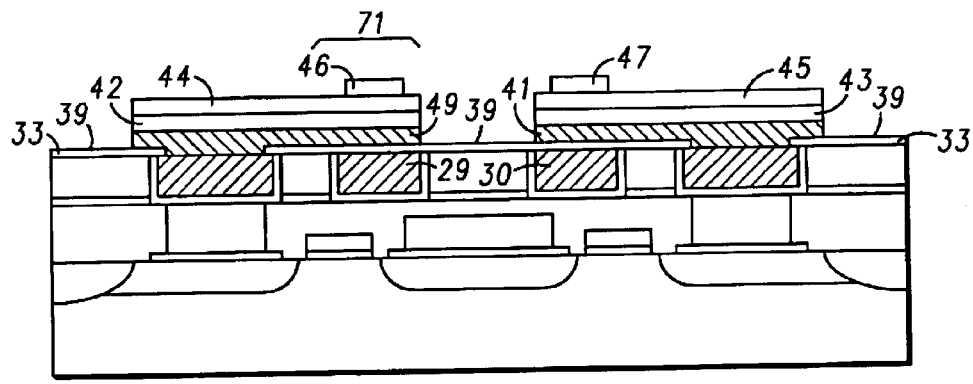

Next, referring to FIG. 6, conductor layers 34, 69, and 70 (see FIG. 5) are patterned and etched to form a conductor material stack comprising conductor layers 49, 42, and 44 and a conductor material stack comprising conductor layers 41, 43, and 45 as illustrated. Also, conductor layer 42 has a top surface and a bottom surface with a top width and a bottom width, respectively. Further, a photoresist layer 46 is positioned proximate to digit line 29 and a photoresist layer 47 is positioned proximate to digit line 30. Photoresist layers 46 and 47 will be used to form a pillar for growing a self-aligned MRAM device, as will be discussed presently with reference to a region 71.

Figure 7:
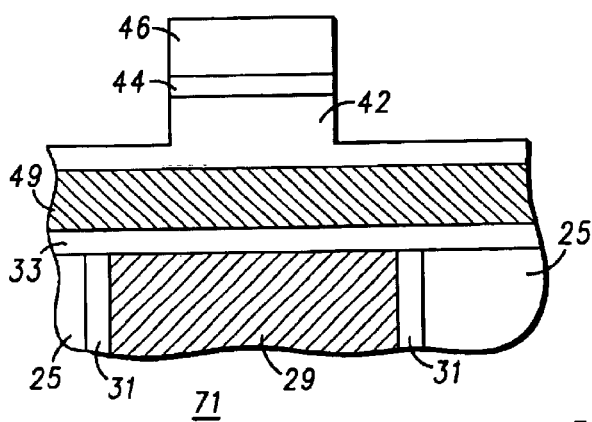
FIGS. 7 through 11 are enlarged cross-sectional views of a portion of the structure shown in FIG. 6 illustrating additional sequential steps.
Figure 8:
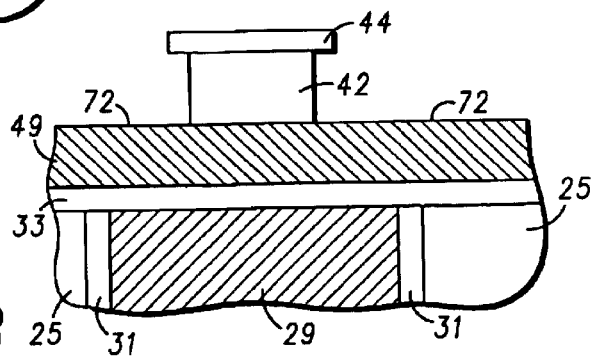

Next, referring to FIG. 7, region 71 is illustrated to show the steps in fabricating a MRAM device. First, photoresist layer 46 is used as a mask to etch the exposed surface of conductor layer 44 through conductor layer 42. As illustrated in FIG. 8, photoresist layer 46 is then removed and conductive layer 42 is selectively etched to a surface 72 wherein an overhang is formed beneath conductive layer 44.

Figure 9:
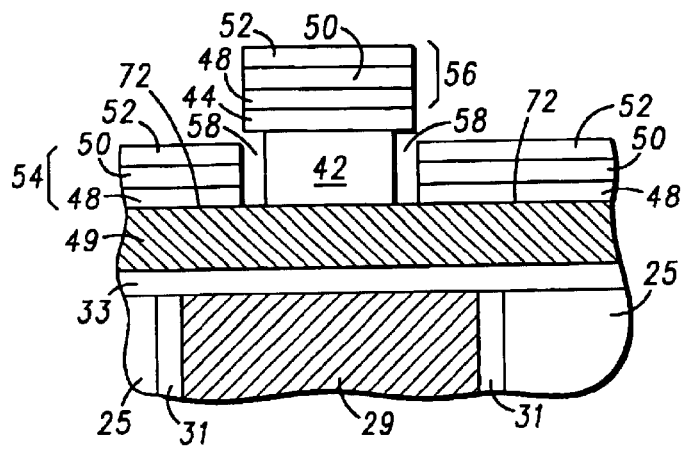

Turning now to FIG. 9, a pinned synthetic anti-ferromagnetic region 48 is deposited on conductor layer 44. A non-ferromagnetic spacer layer 50 is then deposited on conductor layer 44 and a free ferromagnetic region 52 is deposited on conductor layer 50. Pinned synthetic anti-ferromagnetic region 48, non-ferromagnetic spacer layer 50, and free ferromagnetic region 52 form a MRAM device 56, whereby the spacer layer 50 comprises a tunneling junction. Pinned synthetic anti-ferromagnetic region 48, non-ferromagnetic spacer layer 50, and free ferromagnetic region 52 are illustrated in this embodiment as including a single layer for simplicity, but it will be understood that multiple layers could be used.

Figure 10:
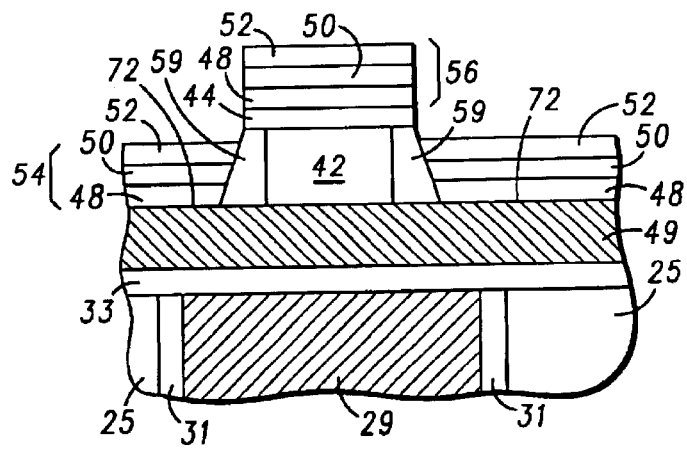
Figure 11:
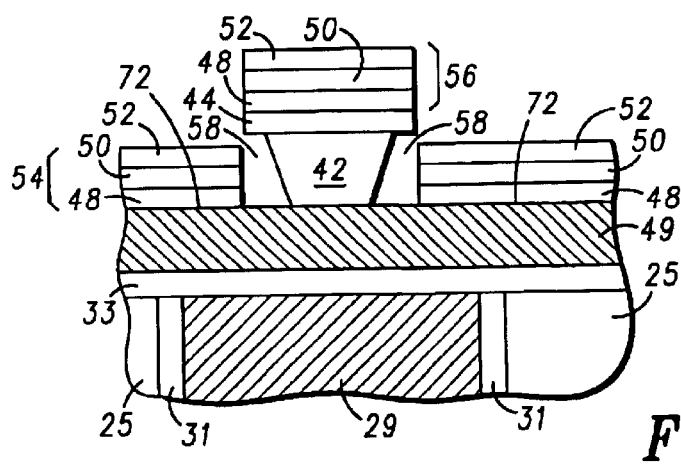

Further, during the deposition of MRAM device 56, a blanket layer 54 will typically be deposited on surface 72. However, blanket layer 54 is separated from MRAM device 56 by a gap 58. In some embodiments, gap 58 can be filled with a dielectric layer 59 before deposition of MRAM device 56, as illustrated in FIG. 10. Dielectric layer 59 serves to provide more electrical isolation between MRAM device 56 and blanket layer 54. Further, in other embodiments, conductor layer 42 can be etched to form a retrograde profile as illustrated in FIG. 11 wherein the top width of conductor layer 42 is greater than the bottom width.

Figure 12:
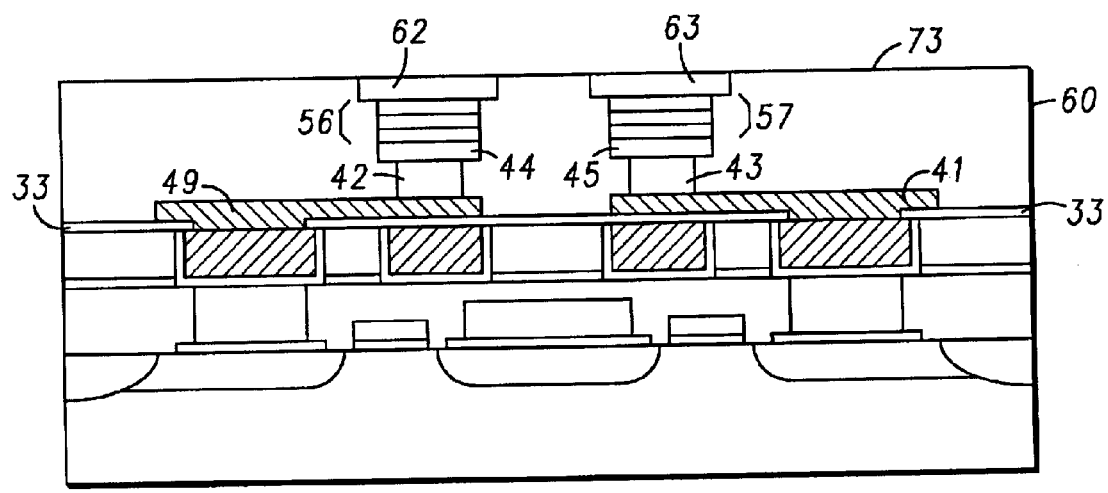
FIGS. 12 and 13 are simplified cross-sectional views, similar to FIG. 6 illustrating final steps in the process.

It will be understood that during the fabrication of MRAM device 56, an array of MRAM devices is usually formed in a similar manner and positioned thereon substrate 11, as illustrated in FIG. 12, where a MRAM device 57 has been deposited adjacent to conductor layers 43 and 45 and proximate to digit line 30. After MRAM devices 56 and 57 have been deposited, a dielectric layer 60 with a surface 73 is formed on dielectric layer 33, conductor layers 41 and 49. Further, dielectric layer 60 is patterned and etched to form a trench adjacent to MRAM devices 56 and 57 wherein an electrically conductive via 62 is deposited on MRAM device 56 and an electrically conductive via 63 is deposited on MRAM device 57. Typically during the deposition of electrically conductive vias 62 and 63, a conductive material will be deposited thereon surface 73 (not shown), which can be removed by CMP or the like to provide a very planar surface on dielectric layer 60.

Figure 13:
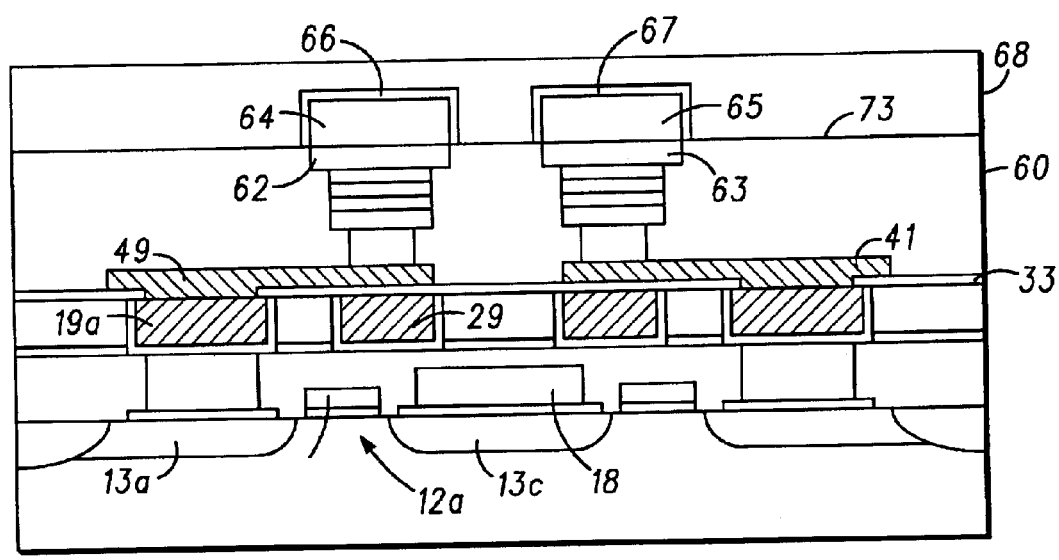

As illustrated in FIG. 13, bit lines 64 and 65 are formed adjacent to electrically conductive vias 62 and 63, respectively. Further, a high permeability layer 66 is deposited thereon bit line 64 and a high permeability layer 67 is deposited thereon bit line 65. A dielectric layer 68 is then deposited on surface 73 and high permeability layers 66 and 67. The formation of bit lines is well known to those skilled in the art and will not be elaborated further here.

Thus, an improved and novel fabrication method for a magnetic memory element is disclosed. Circuitry for controlling magnetic memory element is fabricated first under the process that requires a high temperature processing, for example the CMOS process, and then the magnetic memory elements are formed on the circuitry. Accordingly, MRAM devices are integrated with circuit elements fabricated by the CMOS process and are prevented from degradation of metal composition caused by high temperatures. Further, because the MRAM devices are formed on a conductive material stack, expensive and difficult photolithography processing steps are avoided. Also, the need to etch ferromagnetic layers is eliminated because the MRAM devices are positioned on a pillars which isolates them from subsequent layers grown thereon. This self-alignment feature eliminates the need to etch blanket layer 54, which is typically done with chlorine-based chemistries. The elimination of the etch step is important because the layers included in MRAM device 56 are typically very thin and easily damaged and are also sensitive to corrosion during the etching process.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a magnetoresistive random access memory device comprising the steps of:
   providing a substrate;
   forming a first conductive layer positioned on the substrate;
   depositing a second conductive layer positioned on a portion of the first conductive layer, the second conductive layer having a top surface and a bottom surface wherein the bottom surface is positioned on the first conductive layer and wherein the bottom surface has a bottom width and the top surface has a top width;
   depositing a third conductive layer positioned on the top surface of the second conductive layer;
   etching the second conductive layer to form an undercut gap beneath the third conductive layer; and
   forming a magnetoresistive random access memory device positioned on the third conductive layer, the magnetoresistive random access memory device being isolated from the first conductive layer and subsequent layers grown thereon.

2. A method of fabricating a magnetoresistive random access memory device as claimed in claim 1 wherein the step of forming the magnetoresistive random access memory device includes the steps of:
   depositing a pinned synthetic anti-ferromagnetic region positioned on the third conductive layer;
   depositing a non-ferromagnetic spacer layer positioned on the pinned synthetic anti-ferromagnetic region; and
   depositing a free ferromagnetic region positioned on the non-ferromagnetic spacer layer.

3. A method of fabricating a magnetoresistive random access memory device as claimed in claim 2 wherein the step of depositing the non-ferromagnetic spacer layer includes a step of forming a tunneling junction between the pinned synthetic anti-ferromagnetic region and the free ferromagnetic region.

4. A method of fabricating a magnetoresistive random access memory device as claimed in claim 1 further including the step of forming a dielectric layer positioned on the layers subsequently grown on the surface of the first conductive layer and adjacent to the second conductive layer within the undercut gap beneath the third conductive layer.

5. A method of fabricating a magnetoresistive random access memory device as claimed in claim 1 wherein the step of forming an undercut gap includes etching the second conductive layer to create a retrograde profile wherein the top width is greater than the bottom width.

6. A method of fabricating a magnetoresistive random access memory device as claimed in claim 1 wherein the second conductive layer includes one of tantalum (Ta) and another suitable conductive material.

7. A method of fabricating a magnetoresistive random access memory device as claimed in claim 1 wherein the third conductive layer includes one of aluminum (Al) and another suitable conductive material.

8. A method of fabricating a magnetoresistive random access memory device as claimed in claim 1 wherein the flat surface of the conductive material stack region is formed by using one of chemical mechanical polishing.

* * * * *

UNITED STATES PATENT AND TRADEMARK OFFICE
Certificate

Patent No. 6,783,994 B2                                            Patented: August 31, 2004

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Brian R. Butcher, Gilbert, AZ (US); Kelly W. Kyler, Mesa, AZ (US); Gregory W. Grynkewich, Gilbert, AZ (US); Mark A. Durlam, Chandler, AZ (US); and Earl D. Fuchs, Phoenix, AZ (US).

Signed and Sealed this Eighteenth Day of September 2007.

CARL WHITEHEAD, JR.
*Supervisory Patent Examiner*
Art Unit 2813